(12) United States Patent
Kumagae et al.

(10) Patent No.: US 11,011,315 B2
(45) Date of Patent: May 18, 2021

(54) THIN FILM CAPACITOR, MANUFACTURING METHOD THEREFOR, AND MULTILAYER CIRCUIT BOARD EMBEDDED WITH THIN FILM CAPACITOR

(71) Applicant: TDK CORPORATION, Tokyo (JP)

(72) Inventors: Michihiro Kumagae, Tokyo (JP); Kazuhiro Yoshikawa, Tokyo (JP); Shigeaki Tanaka, Tokyo (JP); Hitoshi Saita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 51 days.

(21) Appl. No.: 16/436,559

(22) Filed: Jun. 10, 2019

(65) Prior Publication Data

US 2019/0392992 A1 Dec. 26, 2019

(30) Foreign Application Priority Data

Jun. 20, 2018 (JP) .............................. JP2018-117393
Apr. 8, 2019 (JP) .............................. JP2019-073256

(51) Int. Cl.
*H01G 4/33* (2006.01)
*H01L 23/498* (2006.01)
*H01L 49/02* (2006.01)
*H05K 1/11* (2006.01)
*H05K 1/16* (2006.01)

(Continued)

(52) U.S. Cl.
CPC ......... *H01G 4/33* (2013.01); *H01L 23/49822* (2013.01); *H01L 23/49827* (2013.01); *H01L 28/55* (2013.01); *H05K 1/09* (2013.01); *H05K 1/115* (2013.01); *H05K 1/162* (2013.01); *H05K 3/467* (2013.01)

(58) Field of Classification Search
CPC ............... H01G 4/33; H01L 23/49822; H01L 23/49827; H01L 28/55; H05K 1/16; H05K 1/162; H05K 1/09; H05K 1/115
See application file for complete search history.

(56) References Cited

U.S. PATENT DOCUMENTS 6,521,934 B2 * 2/2003 Yasuda ............. H01L 21/76897
257/296
7,525,175 B2 * 4/2009 Kariya ................... H01G 4/232
257/532

(Continued)

FOREIGN PATENT DOCUMENTS

JP 2007173386 A 7/2007
JP 2017130653 A 7/2017

*Primary Examiner* — Hoa C Nguyen
(74) *Attorney, Agent, or Firm* — Young Law Firm, P.C.

(57) ABSTRACT

Disclosed herein is a thin film capacitor that includes a capacitive insulating film having first and second through holes, a first metal film provided on one surface of the capacitive insulating film, and a second metal film provided on the other surface of the capacitive insulating film. The first and second metal films are made of different metal materials from each other. The first metal film is divided into a first area positioned outside the first space and a second area positioned inside the first space. The second metal film is divided into a third area positioned outside the second space and a fourth area positioned inside the second space. The third area is connected to the second area through the first through hole. The fourth area is connected to the first area through the second through hole.

8 Claims, 9 Drawing Sheets

(51) Int. Cl.
  *H05K 3/46* (2006.01)
  *H05K 1/09* (2006.01)

(56) References Cited

U.S. PATENT DOCUMENTS

| | | | |
|---|---|---|---|
| 2004/0119075 A1* | 6/2004 | Murade | H01L 29/78633 257/72 |
| 2004/0130849 A1* | 7/2004 | Kurihara | H01G 4/228 361/311 |
| 2006/0180938 A1* | 8/2006 | Kurihara | H01L 24/16 257/773 |
| 2007/0141800 A1 | 6/2007 | Kurihara et al. | |
| 2007/0164282 A1* | 7/2007 | Ishii | G02F 1/136209 257/59 |
| 2008/0003765 A1* | 1/2008 | Seh | H05K 1/162 438/396 |
| 2009/0038835 A1* | 2/2009 | Tanaka | H05K 1/162 174/260 |
| 2009/0231820 A1* | 9/2009 | Tanaka | H01L 23/49827 361/764 |
| 2009/0290316 A1* | 11/2009 | Kariya | H01L 23/50 361/767 |
| 2016/0088736 A1 | 3/2016 | Sankman et al. | |
| 2019/0221515 A1* | 7/2019 | Gu | H01L 23/5223 |

* cited by examiner

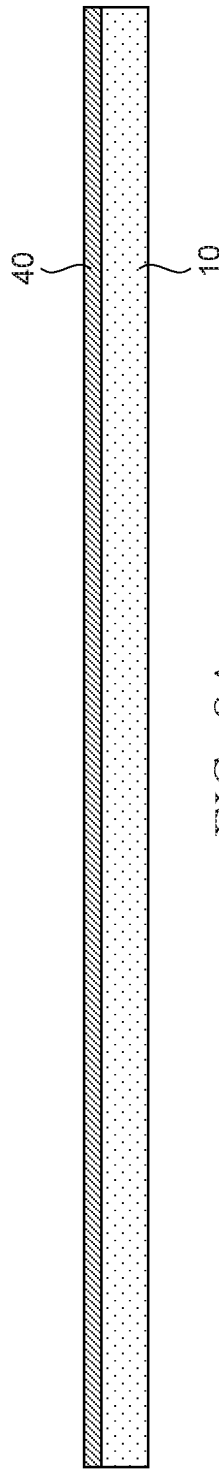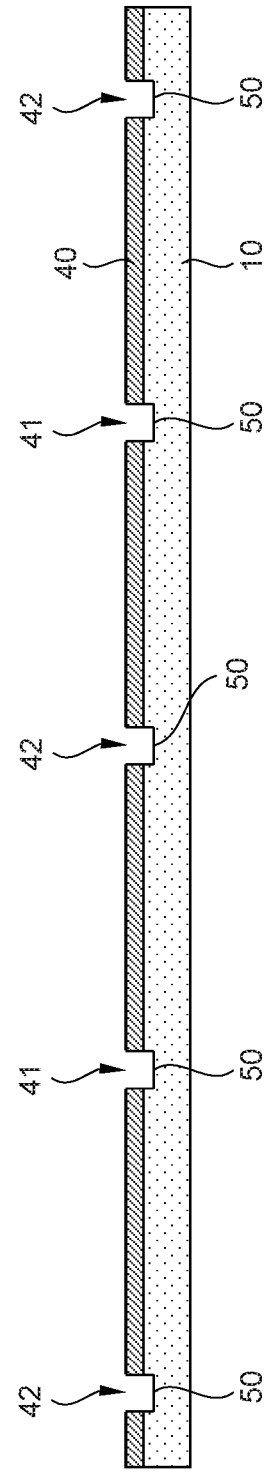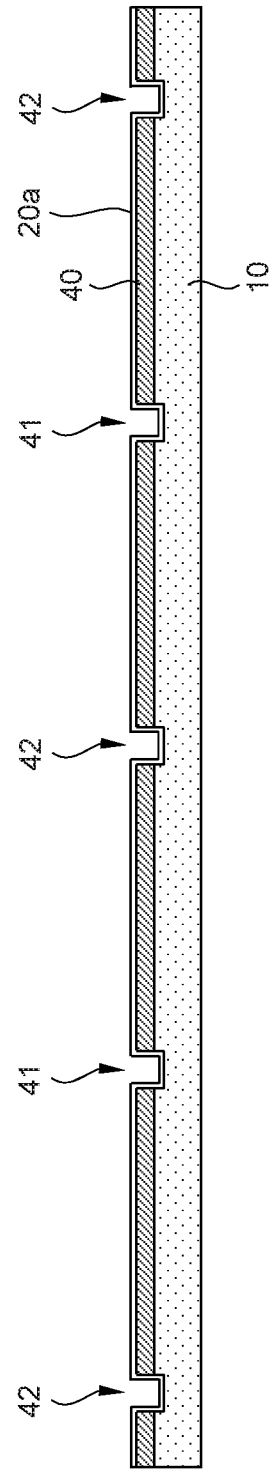

THIN FILM CAPACITOR, MANUFACTURING METHOD THEREFOR, AND MULTILAYER CIRCUIT BOARD EMBEDDED WITH THIN FILM CAPACITOR

BACKGROUND OF THE INVENTION

Field of the Invention

The present invention relates to a thin film capacitor and a manufacturing method therefor and, more particularly, to a thin film capacitor that can be produced at low cost, a manufacturing method therefor, and a multilayer circuit board embedded with the thin film capacitor.

Description of Related Art

A thin film capacitor is used mainly as a decoupling capacitor for stabilizing power supply voltage. For example, JP 2017-130653 A and JP 2007-173386 A dispose an interposer thin film capacitor.

However, the thin film capacitor disclosed in JP 2017-130653 A has a build-up structure, which may complicate the manufacturing process. Further, the thin film capacitor disclosed in JP 2017-173386 A has a structure in which a capacitor is formed on a support substrate made of an insulator such as silicon, so that when it is used as an interposer, a through hole needs to be formed in the support substrate, which may complicate the manufacturing process.

SUMMARY

It is therefore an object of the present invention to provide a thin film capacitor that can be produced at low cost, a manufacturing method therefor, and a multilayer circuit board embedded with the thin film capacitor.

A thin film capacitor according to the present invention includes a capacitive insulating film having a plurality of through holes including first and second through holes; a first metal film provided on one surface of the capacitive insulating film; and a second metal film provided on the other surface of the capacitive insulating film and made of a metal material different from that of the first metal film. A first space is provided in the first metal film so as to surround the first through hole in a plan view, whereby the first metal film is divided into a first area positioned outside the first space and a second area positioned inside the first space. A second space is provided in the second metal film so as to surround the second through hole in a plan view, whereby the second metal film is divided into a third area positioned outside the second space and a fourth area positioned inside the second space. The third area of the second metal film penetrates the first through hole and is connected to the second area of the first metal film through a first connection part provided so as to bite into the first metal film. The fourth area of the second metal film penetrates the second through hole and is connected to the first area of the first metal film through a second connection part provided so as to bite into the first metal film.

A multilayer circuit board according to the present invention is embedded with the above thin film capacitor.

According to the present invention, the first and second metal films are disposed on the front and back sides of the capacitive insulating film, respectively, and connected to each other through the first and second through holes formed in the capacitive insulating film without using a support substrate formed of an insulator. Thus, it is possible to produce the thin film capacitor at lower cost and to reduce the entire thickness of the thin film capacitor, as compared to a thin film capacitor having a build-up structure or a structure in which a through hole is formed in a support substrate. In addition, the first and second connection parts of the second metal film are provided so as to bite into the first metal film, so that adhesion between the first and second metal films is enhanced.

In the present invention, the capacitive insulating film may be made of a ceramic material. As the ceramic material, a ceramic material having, e.g., a perovskite structure can be used.

In the present invention, the first metal film may be made of Ni, and the second metal film may be made of Cu. This allows the capacitive insulating film made of a ceramic material to be baked with the first metal film and capacitive insulating film overlapping each other.

In the present invention, the bite depths of the respective first and second connection parts into the first metal film may differ from each other. With this configuration, the location of potential difference at the joint interface between different types of metals caused due to a temperature difference varies in the depth direction, reducing noise component generated due to the potential difference.

In the present invention, an inorganic or organic matter derived from a capacitive insulating film formation process may locally exist on the other surface of the capacitive insulating film, one of the first and second connection parts may be provided so as to penetrate a part of the capacitive insulating film covered with the inorganic or organic matter, the other one thereof may be provided so as to penetrate a part of the capacitive insulating film not covered with the inorganic or organic matter, and the bite depth of one of the first and second connection parts into the first metal film may be less than the bite depth of the other one thereof. Specifically, the inorganic or organic matter derived from a capacitive insulating film formation process is an inclusion getting in through a process and inevitably resides. With this configuration, local electrolytic concentration can be alleviated to reduce leak current.

In the present invention, a barrier metal may be provided at the boundary surface between the first and second metal films. This can prevent migration in the first metal film or second metal film.

The thin film capacitor according to the present invention may further include a third metal film deposited on the first metal film and having the same planar shape as the first metal film, and the second and third metal films may be made of the same metal material. This can eliminate a difference in directivity between the front and back sides.

A thin film capacitor manufacturing method according to the present invention includes: a first step of forming a capacitive insulating film on a first metal film; a second step of forming first and second through holes in the capacitive insulating film and overetching the first metal film exposed through the first and second through holes to form recesses in the first metal film; a third step of forming a second metal film made of a metal material different from that of the first metal film on the surface of the capacitive insulating film, inside the first and second through holes, and in the recess of the first metal film; and a fourth step of forming a first space in the first metal film so as to surround the first through hole in a plan view and forming a second space in the second metal film so as to surround the second through hole in a plan view.

According to the present invention, the first and second metal films are connected to each other through the first and second through holes formed in the capacitive insulating film, the first space is formed in the first metal film so as to surround the first through hole, and the second space is formed in the second metal film so as to surround the second through hole. This allows an interposer thin film capacitor to be produced through a simple process. In addition, the first metal film is overetched when the first and second through holes are formed in the capacitive insulating film, so that the second metal film can be made to bite into the first metal film, thereby enhancing adhesion between the first and second metal films.

As described above, according to the present invention, there can be provided a thin film capacitor that can be produced at low cost, a manufacturing method therefor, and a multilayer circuit board embedded with the thin film capacitor.

BRIEF DESCRIPTION OF THE DRAWINGS

The above features and advantages of the present invention will be more apparent from the following description of certain preferred embodiments taken in conjunction with the accompanying drawings, in which:

FIGS. 2A to 2C are schematic plan views of respective layers constituting the thin film capacitor 1, in which FIG. 2A illustrates the shape of a second metal film 20, FIG. 2B illustrates the shape of a capacitive insulating film 40, and FIG. 2C illustrates the shape of a first metal film 10;

FIGS. 3A to 3C are process views for explaining a manufacturing method for the thin film capacitor 1;

DETAILED DESCRIPTION OF THE EMBODIMENTS

Hereinafter, preferred embodiments of the present invention will be described in detail with reference to the accompanying drawings.

Figure 1:
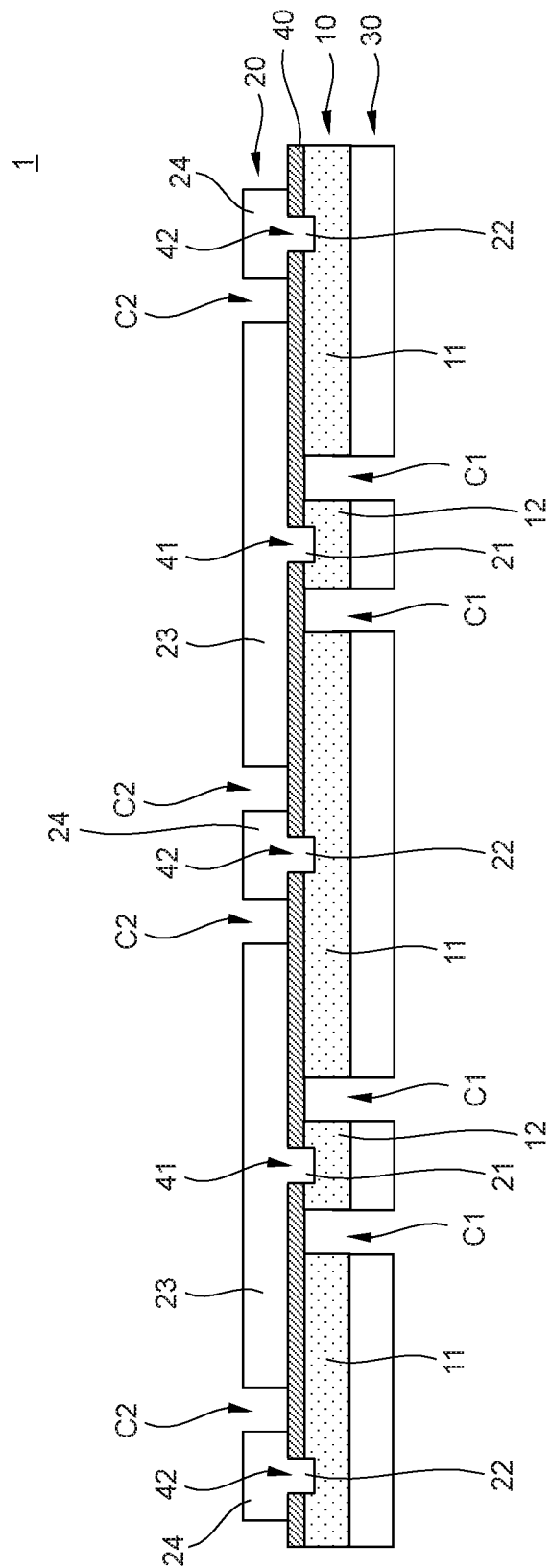
FIG. 1 is a schematic cross-sectional view for explaining the structure of a thin film capacitor 1 according to a first embodiment of the present invention.

FIG. 1 is a schematic cross-sectional view for explaining the structure of a thin film capacitor 1 according to the first embodiment of the present invention.

Figure 2A:
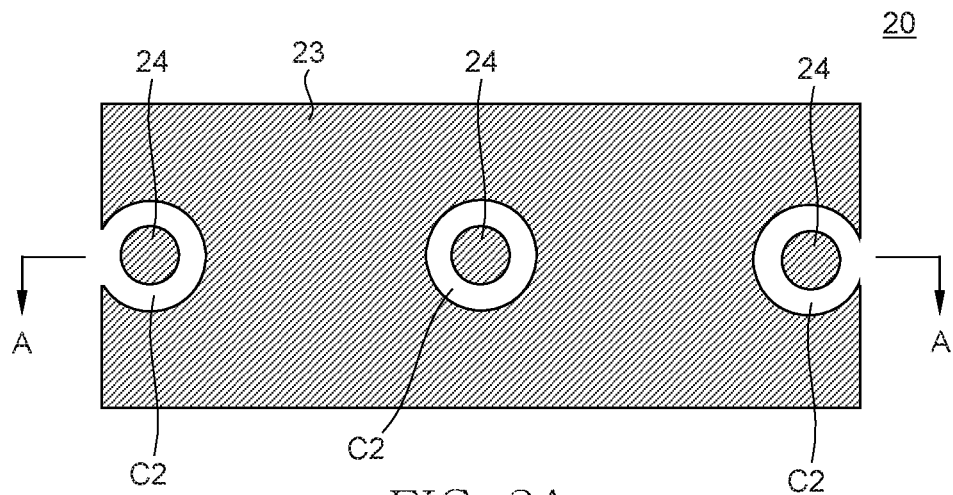
Figure 2B:
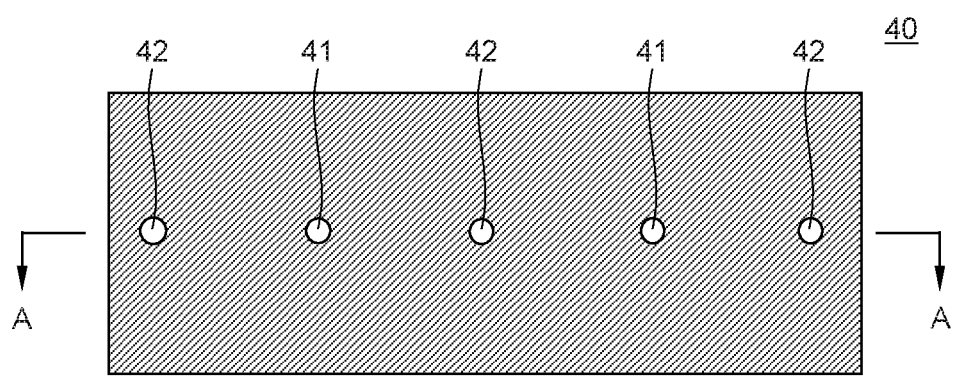
Figure 2C:
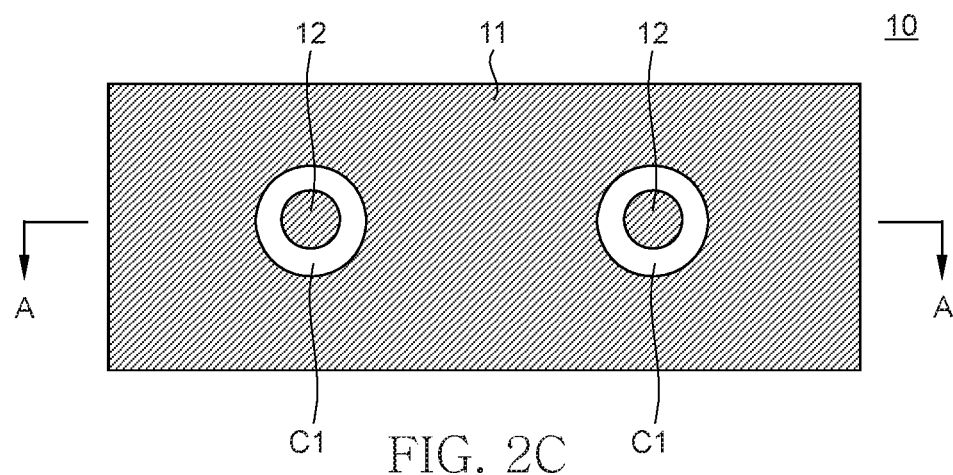

As illustrated in FIG. 1, the thin film capacitor 1 according to the first embodiment includes a capacitive insulating film 40, first and second metal films 10 and 20 formed on the front and back sides of the capacitive insulating film 40, respectively, and a third metal film 30 provided so as to overlap the first metal film 10. FIGS. 2A to 2C are schematic plan views of respective layers constituting the thin film capacitor 1. FIG. 2A illustrates the shape of the second metal film 20, FIG. 2B illustrates the shape of the capacitive insulating film 40, and FIG. 2C illustrates the shape of the first metal film 10. FIG. 1 illustrates a cross section taken along line A-A in FIGS. 2A to 2C.

The capacitive insulating film 40 is made of a ceramic material having a perovskite structure, such as barium titanate. First through holes 41 and second through holes 42 are formed in the capacitive insulating film 40. The first and second through holes 41 and 42 are alternately arranged in one direction.

The first metal film 10 is made of, e.g., Ni (nickel) and is formed on one surface of the capacitive insulating film 40. First spaces C1 are formed in the first metal film 10 so as to each surround the first through hole 41 in a plan view. As a result, the first metal film 10 is divided into a first area 11 positioned outside the first space C1 and a second area 12 positioned inside the first space C1. The first and second areas 11 and 12 are electrically insulated by the first space C1. One of the first and second areas 11 and 12 is used as the positive electrode of the thin film capacitor, and the other one thereof is used as the negative electrode of the thin film capacitor. The reason that Ni (nickel) is used as the material of the first metal film 10 is that, as described later, the first metal film 10 is used as the support body for the capacitive insulating film 40 in a process of baking the capacitive insulating film 40 and thus needs to withstand high temperatures.

The second metal film 20 is made of, e.g., Cu (copper) and is formed on the other surface of the capacitive insulating film 40. Second spaces C2 are formed in the second metal film 20 so as to each surround the second through hole 42 in a plan view. As a result, the second metal film 20 is divided into a third area 23 positioned outside the second space C2 and a fourth area 24 positioned inside the second space C2. The third and fourth areas 23 and 24 are electrically insulated by the second space C2. One of the third and fourth areas 23 and 24 is used as the positive electrode of the thin film capacitor, and the other one thereof is used as the negative electrode of the thin film capacitor. The reason that Cu (copper) is used as the material of the second metal film 20 is that Cu is low in resistance value and facilitates film formation by electroplating.

The third metal film 30 is made of, e.g., Cu (copper). The third metal film 30 disposed on the first metal film 10 has the same planar shape as the first metal film 10.

As illustrated in FIG. 1, the second metal film 20 is connected to the first metal film 10 through the through holes 41 and 42 formed in the capacitive insulating film 40. More specifically, the third area 23 of the second metal film 20 has a first connection part 21 penetrating the first through hole 41 and is connected to the second area 12 of the first metal film 10 through the first connection part 21. On the other hand, the fourth area 24 of the second metal film 20 has a second connection part 22 penetrating the second through hole 42 and is connected to the first area 11 of the first metal film 10 through the second connection part 22.

Thus, the first area 11 of the first metal film 10 and the fourth area 24 of the second metal film 20 are electrically short-circuited. Similarly, the second area 12 of the first metal film 10 and the third area 23 of the second metal film 20 are electrically short-circuited. As illustrated in FIG. 1, the first area 11 of the first metal film 10 and the third area 23 of the second metal film 20 partially overlap each other through the capacitive insulating film 40, whereby a capacitance can be obtained at the overlap portion. As a result, a thin film capacitor with the first area 11 (fourth area 24 of the second metal film 20) of the first metal film 10 as one of the positive and negative electrodes and with the second area 12 (third area 23 of the second metal film 20) of the first metal film 10 as the other one of the positive and negative electrodes is constituted.

In the present embodiment, both the positive and negative electrodes appear on each of the front and back sides of the thin film capacitor 1, allowing the thin film capacitor 1 to be used as an interposer. In addition, the front and back pattern shapes coincide with each other except that the spaces C1 and C2 are shifted by one pitch, so that an interposer having no difference in directivity between the front and back sides is achieved.

Further, in the present embodiment, the first and second connection parts 21 and 22 each constituting a part of the second metal film 20 are provided so as to bite into the first metal film 10, so that adhesion between the first and second metal films 10 and 20 is enhanced. The depth of the bite is preferably 2 μm or less. This is because when a recess having a dimension exceeding 2 μm is formed, a process load becomes large to deteriorate productivity.

Although not particularly limited, the bite depths of the respective first and second connection parts 21 and 22 into the first metal film 10 may differ from each other. Further, the bite depths of the plurality of respective first connection parts 21 into the first metal film 10 may differ from each other, and the bite depths of the plurality of respective second connection parts 22 into the first metal film 10 may differ from each other.

When heat from a processor or the like is applied to the thin film capacitor 1, a potential difference occurs in the joint interface between the first and second metal films 10 and 20 which are made of mutually different types of metal. Such a potential difference may become a noise component of a decoupling capacitor; however, when a variation exists in the bite depth of the second metal film 20, the location of potential difference at the joint interface between different types of metals varies in the depth direction, allowing reduction in the noise component.

The following describes a manufacturing method for the thin film capacitor 1 according to the present embodiment.

FIGS. 3A to 3C and FIGS. 4A to 4C are process views for explaining the manufacturing method for the thin film capacitor 1 according to the present embodiment.

First, as illustrated in FIG. 3A, the capacitive insulating film 40 made of barium titanate or the like is formed on the surface of the first metal film 10 made of Ni or the like and baked. While being subjected to high temperature at this time, the first metal film 10 can withstand the baking temperature since it is made of high-meting point metal such as Ni.

Then, as illustrated in FIG. 3B, the capacitive insulating film 40 is etched to form the first and second through holes 41 and 42. At this time, over-etching is performed even after formation of the first and second through holes 41 and 42 to form a recess 50 in the first metal film 10. The depth of the recess 50 differs depending on whether or not the through holes 41 and 42 are formed at a portion covered with an insulator or an organic matter derived from a capacitive insulating film formation process.

Figure 5A:
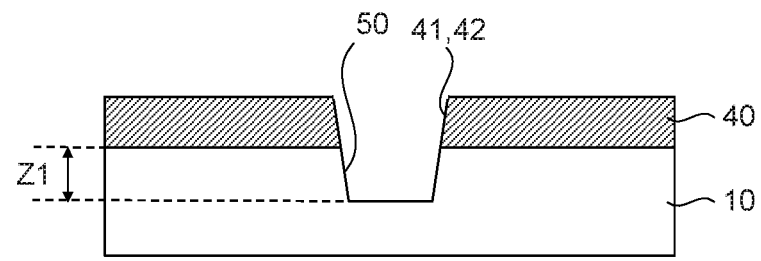
FIGS. 5A and 5B are schematic views for explaining the reason that the depth of over-etching differs in each through hole to be formed.
Figure 5B:
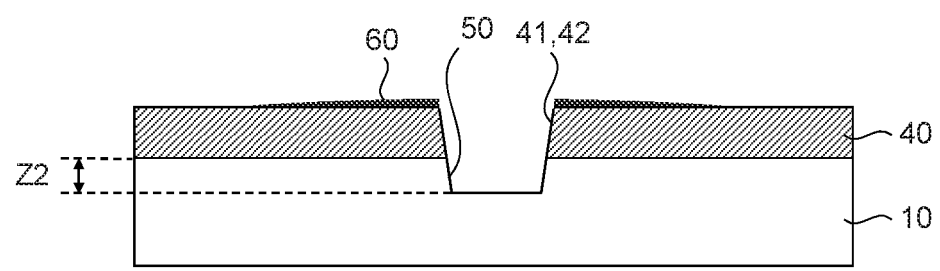

That is, as illustrated in FIG. 5A, when etching is applied to a part of the capacitive insulating film 40 that is not covered with an insulator or an organic matter derived from a capacitive insulating film formation process, a depth Z1 of the recess 50 formed by over-etching of the first metal film 10 becomes a designed value. On the other hand, as illustrated in FIG. 5B, when etching is applied to a part of the capacitive insulating film 40 that is covered with an insulator or an organic matter 60 derived from a capacitive insulating film formation process, a depth Z2 of the recess 50 formed by over-etching of the first metal film 10 becomes less than a designed value (Z1>Z2). This is because etching speed becomes slower due to the existence of the insulator or organic matter 60. Further, a variation also exists in the thickness of the insulator or organic matter 60, so that the depth of the recess 50 is varied.

Figure 6A:
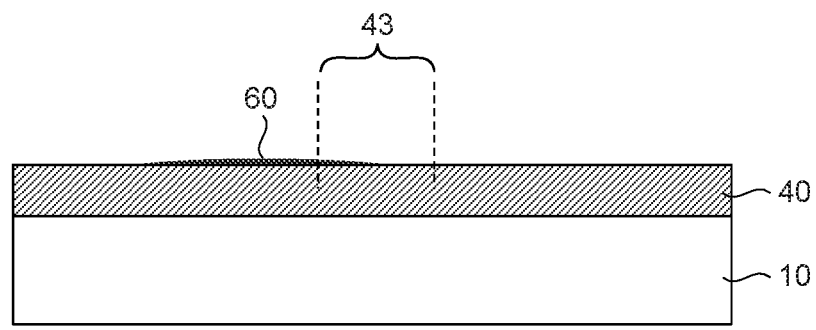
FIGS. 6A and 6B are schematic views for explaining the reason that a step 51 is formed on the bottom surface of a recess 50.
Figure 6B:
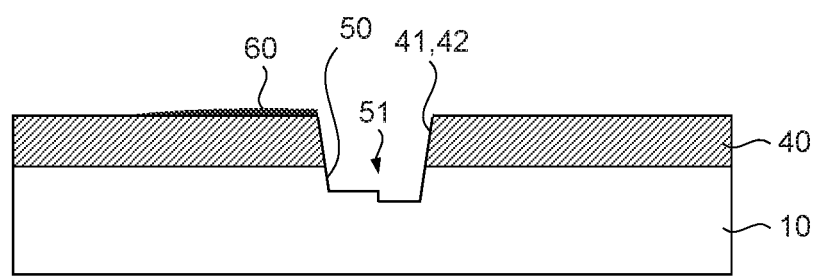
Figure 7A:
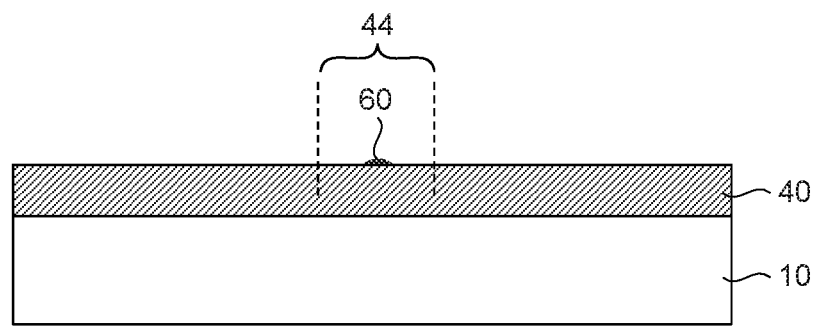
FIGS. 7A and 7B are schematic views for explaining the reason that a protrusion 52 is formed on the bottom surface of the recess 50.
Figure 7B:
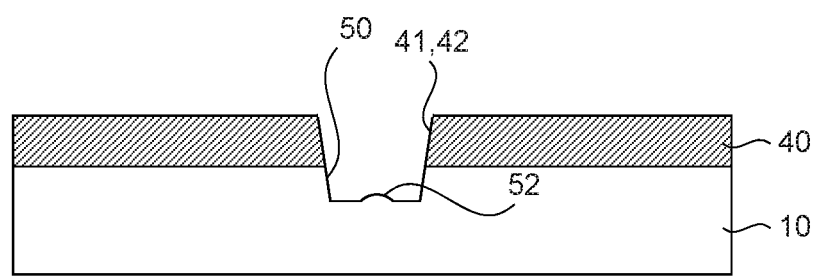

Further, as illustrated in FIG. 6A, when etching is applied to an area 43 overlapping the edge of the insulator or organic matter 60, a step 51 is formed on the bottom surface of the recess 50 as illustrated in FIG. 6B. Further, as illustrated in FIG. 7A, when etching is applied to an area 44 including the entire insulator or the organic matter 60 having a small size, a protrusion 52 is formed on the bottom surface of the recess 50. As described above, the step 51 or protrusion 52 may be formed on the bottom surface of the recess 50 depending on the relationship between the insulator or organic matter 60 and the etching area.

Then, as illustrated in FIG. 3C, a seed layer 20a is formed by a sputtering method or the like. As a result, the seed layer 20a is formed not only on the surface of the capacitive insulating film 40, but also on the inner walls of the respective through holes 41 and 42 and inner wall of the recess 50. The seed layer 20a is preferably formed using a laminated film of Ni and Cu.

Figure 4A:
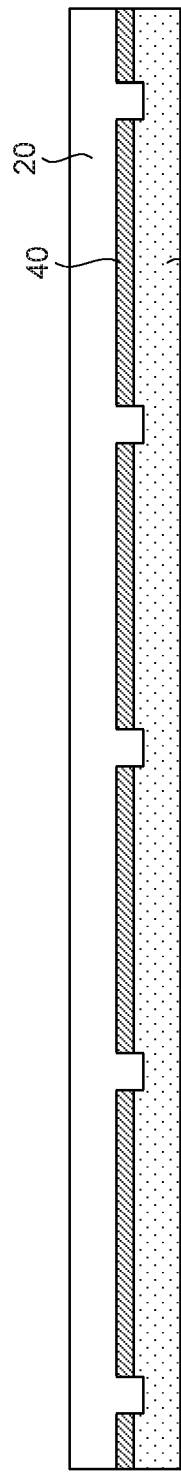
FIGS. 4A to 4C are process views for explaining the manufacturing method for the thin film capacitor 1.
Figure 4B:
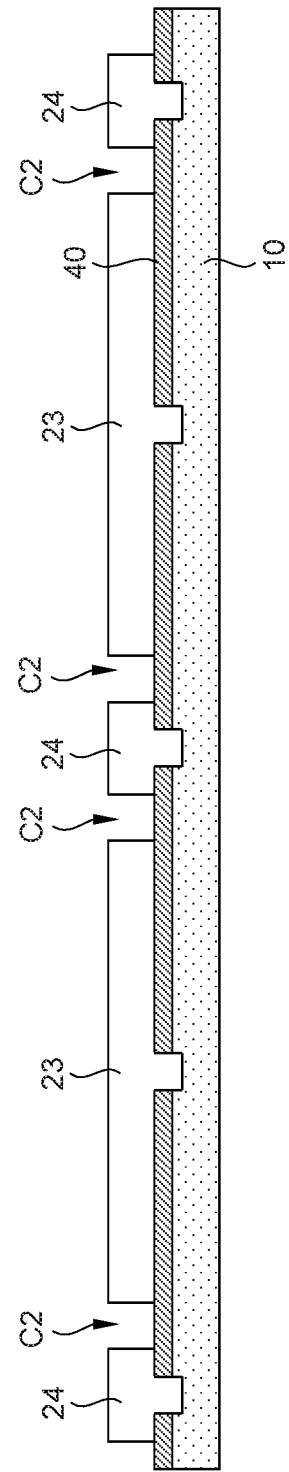

Then, as illustrated in FIG. 4A, electrolytic plating is performed with the seed layer 20a as a power feeder to form the second metal film 20 made of Cu. As a result, the second metal film 20 is formed on the surface of the capacitive insulating film 40, inside the first and second through holes 41 and 42, and in the recess 50 of the first metal film 10. Thereafter, as illustrated in FIG. 4B, the second space C2 is formed in the second metal film 20 to divide the second metal film 20 into the third and fourth areas 23 and 24.

Figure 4C:
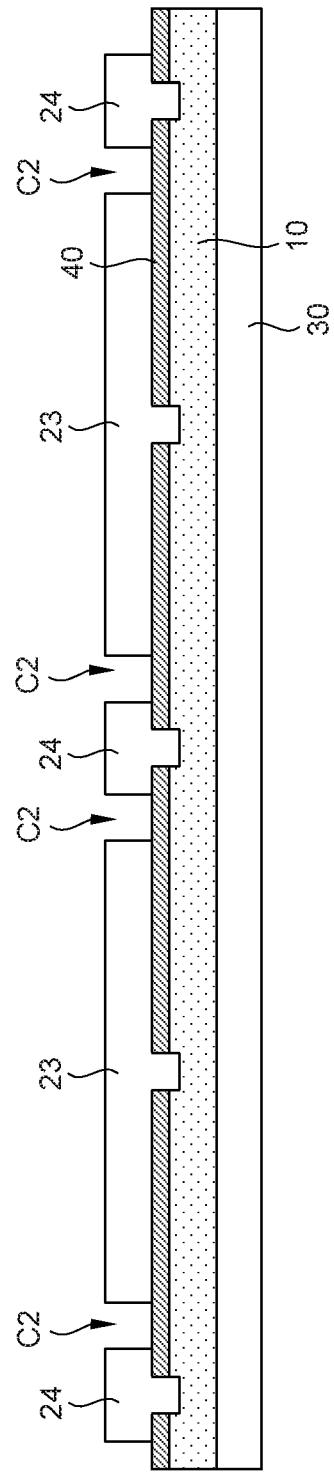

Then, as illustrated in FIG. 4C, the third metal film 30 made of Cu is formed on the back side of the first metal film 10, followed by formation of the first space C1 in the first and third metal films 10 and 30 to divide each of the first and third metal films 10 and 30 into the first area 11 and second area 12, whereby the thin film capacitor illustrated in FIG. 1 is accomplished.

As described above, in the thin film capacitor 1 according to the present embodiment, the first and second metal films 10 and 20 are disposed on the front and back sides of the capacitive insulating film 40, respectively, and connected to each other through the through holes 41 and 42 formed in the capacitive insulating film 40 without using an insulating substrate or the like, so that it is possible to obtain a thin structure suitable for an interposer. In addition, the first and second connection parts 21 and 22 each constituting a part of the second metal film 20 are provided so as to bite into the first metal film 10, so that adhesion between the first and second metal films 10 and 20 is ensured.

Figure 8:
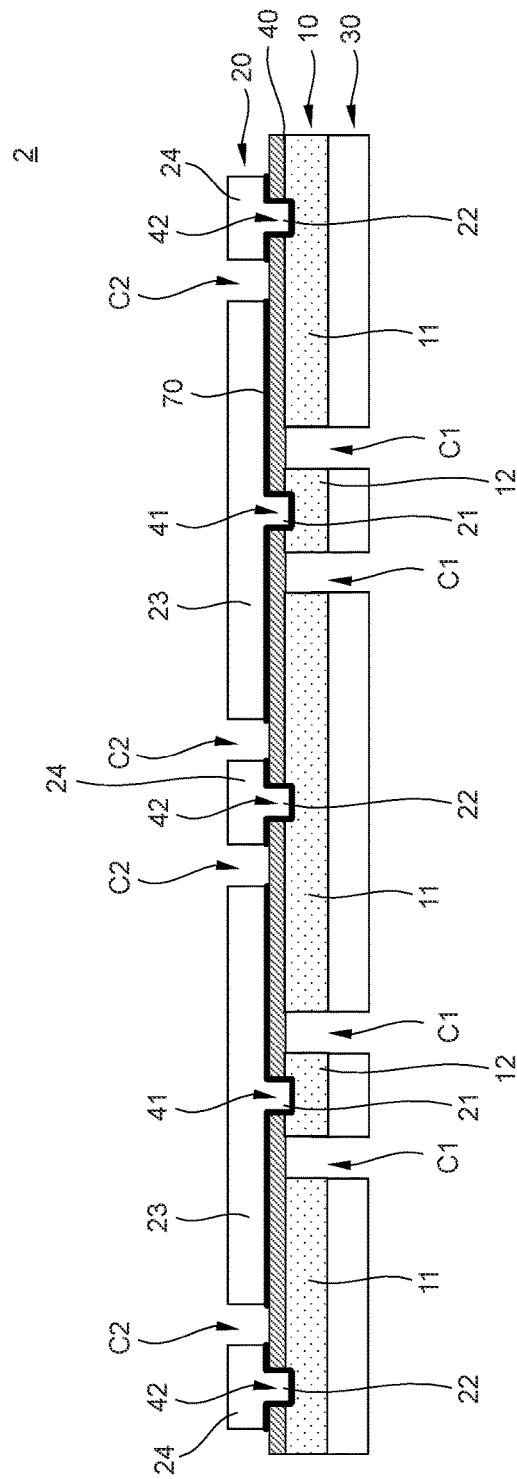
FIG. 8 is a schematic cross-sectional view for explaining the structure of a thin film capacitor 2 according to a second embodiment of the present invention.

FIG. 8 is a schematic cross-sectional view for explaining the structure of a thin film capacitor 2 according to the second embodiment of the present invention.

As illustrated in FIG. 8, the thin film capacitor 2 according to the second embodiment differs from the thin film capacitor 1 according to the first embodiment in that a barrier metal 70 is provided as the base of the second metal film 20. Other configurations are the same as those of the thin film capacitor 1 according to the first embodiment, so the same reference numerals are given to the same elements, and overlapping description will be omitted.

The barrier metal 70 is provided for preventing migration from the second metal film 20 to the first metal film 10. As the material of the barrier metal 70, a material having a higher melting point than the second metal film 20, such as tungsten, can be used.

Figure 9:
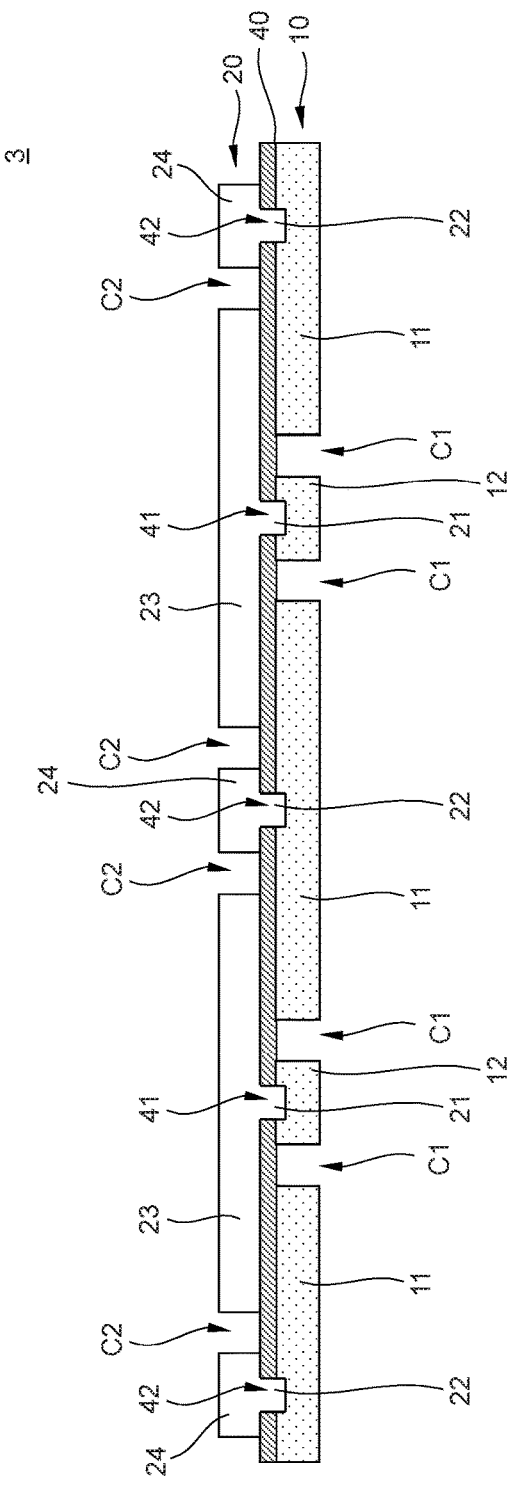
FIG. 9 is a schematic cross-sectional view for explaining the structure of a thin film capacitor 3 according to a third embodiment of the present invention.

FIG. 9 is a schematic cross-sectional view for explaining the structure of a thin film capacitor 3 according to the third embodiment of the present invention.

As illustrated in FIG. 9, the thin film capacitor 3 according to the third embodiment differs from the thin film capacitor 1 according to the first embodiment in that the third metal film 30 is omitted. Other configurations are the same as those of the thin film capacitor 1 according to the first embodiment, so the same reference numerals are given to the same elements, and overlapping description will be omitted.

As exemplified in the present embodiment, the third metal film 30 may not necessarily be provided in the present invention, and the first metal film 10 made of Ni or the like may be used directly as an external terminal.

Figure 10:
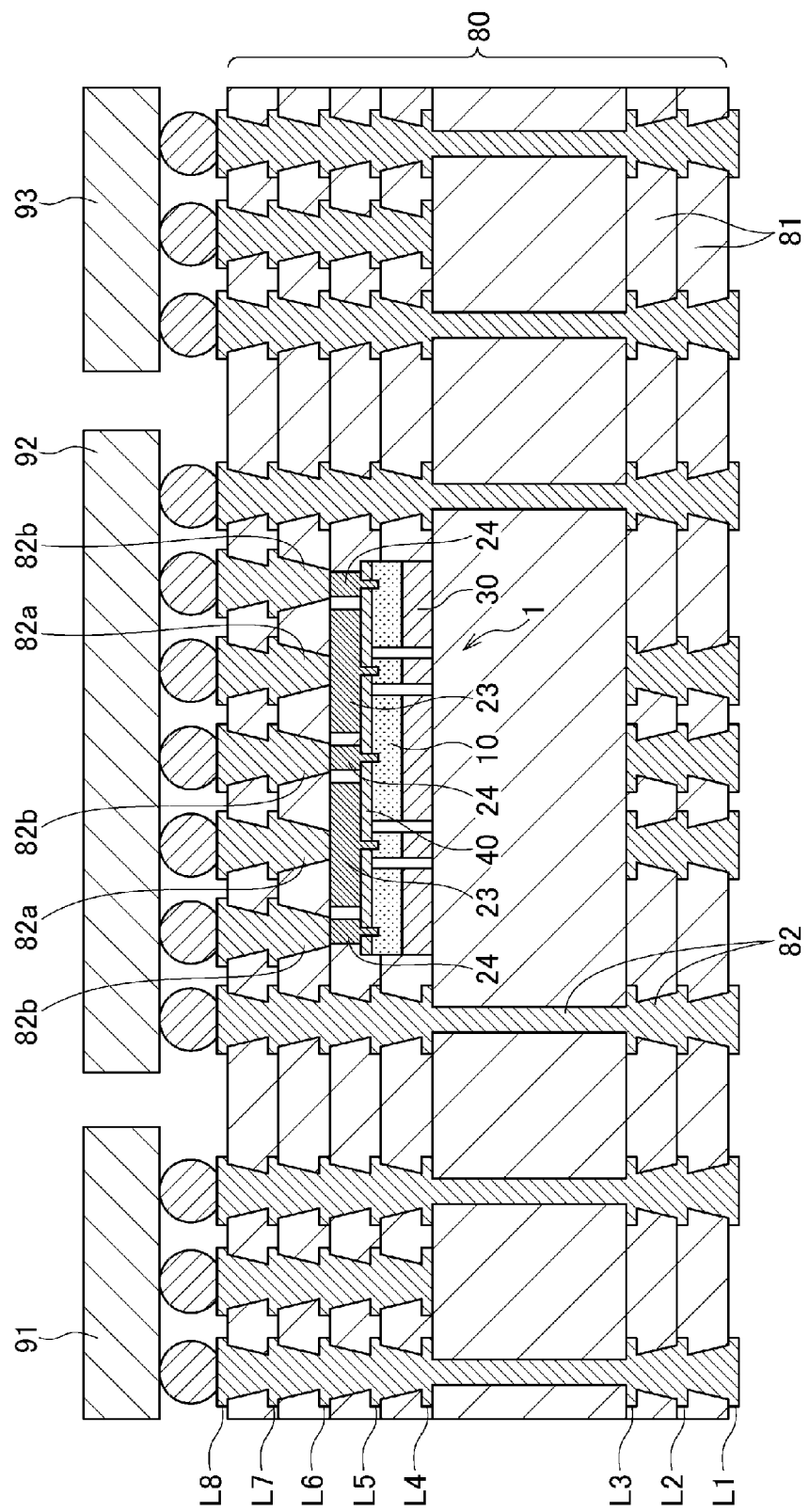
FIG. 10 is a schematic cross-sectional view for explaining the structure of a multilayer circuit board 80 embedded with the thin film capacitor 1 according to the first embodiment.

FIG. 10 is a schematic cross-sectional view for explaining the structure of a multilayer circuit board 80 embedded with the thin film capacitor 1 according to the first embodiment.

In the example illustrated in FIG. 10, the multilayer circuit board 80 has wiring layers L1 to L8, and an interlayer insulating film 81 is provided between mutually adjacent wiring layers. The different wiring layers are connected to each other through via conductors 82. A plurality of IC chips 91 to 93 are mounted on the uppermost wiring layer L8. The thin film capacitor 1 is embedded in the multilayer circuit board 80 having the above configuration. Further, a via conductor 82a applied with a power supply potential, for example, is connected to the third area 23 of the second metal film 20, and a via conductor 82b applied with a ground potential is connected to the fourth area 24 of the second metal film 20. As a result, the thin film capacitor 1 functions as a decoupling capacitor.

It is apparent that the present invention is not limited to the above embodiments, but may be modified and changed without departing from the scope and spirit of the invention.

What is claimed is:
1. A thin film capacitor comprising:
a capacitive insulating film having a plurality of through holes including first and second through holes;
a first metal film provided on one surface of the capacitive insulating film; and
a second metal film provided on other surface of the capacitive insulating film,
wherein the first and second metal films are made of different metal materials from each other,
wherein a first space is provided in the first metal film so as to surround the first through hole in a plan view, whereby the first metal film is divided into a first area positioned outside the first space and a second area positioned inside the first space,
wherein a second space is provided in the second metal film so as to surround the second through hole in a plan view, whereby the second metal film is divided into a third area positioned outside the second space and a fourth area positioned inside the second space,
wherein the third area of the second metal film penetrates the first through hole and is connected to the second area of the first metal film through a first connection part provided so as to bite into the first metal film, and
wherein the fourth area of the second metal film penetrates the second through hole and is connected to the first area of the first metal film through a second connection part provided so as to bite into the first metal film.

2. The thin film capacitor as claimed in claim 1, wherein the capacitive insulating film is made of a dielectric material having a perovskite structure.

3. The thin film capacitor as claimed in claim 1, wherein the first metal film is made of Ni, and the second metal film is made of Cu.

4. The thin film capacitor as claimed in claim 1, wherein bite depths of the respective first and second connection parts into the first metal film differ from each other.

5. The thin film capacitor as claimed in claim 4,
wherein an inorganic or organic matter derived from a capacitive insulating film formation process locally exists on the other surface of the capacitive insulating film,
wherein one of the first and second connection parts is provided so as to penetrate a part of the capacitive insulating film covered with the inorganic or organic matter,
wherein other one of the first and second connection parts is provided so as to penetrate a part of the capacitive insulating film not covered with the inorganic or organic matter, and
wherein the bite depth of the one of the first and second connection parts into the first metal film is less than the bite depth of the other one of the first and second connection parts.

6. The thin film capacitor as claimed in claim 1, further comprising a barrier metal provided at a boundary surface between the first and second metal films.

7. The thin film capacitor as claimed in claim 1, further comprising a third metal film deposited on the first metal film and having a same planar shape as the first metal film,
wherein the second and third metal films are made of a same metal material.

8. A multilayer circuit board embedded with a thin film capacitor, the thin film capacitor comprising:
a capacitive insulating film having a plurality of through holes including first and second through holes;
a first metal film provided on one surface of the capacitive insulating film; and
a second metal film provided on other surface of the capacitive insulating film,
wherein the first and second metal films are made of different metal materials from each other,
wherein a first space is provided in the first metal film so as to surround the first through hole in a plan view, whereby the first metal film is divided into a first area positioned outside the first space and a second area positioned inside the first space,
wherein a second space is provided in the second metal film so as to surround the second through hole in a plan view, whereby the second metal film is divided into a third area positioned outside the second space and a fourth area positioned inside the second space,
wherein the third area of the second metal film penetrates the first through hole and is connected to the second area of the first metal film through a first connection part provided so as to bite into the first metal film, and
wherein the fourth area of the second metal film penetrates the second through hole and is connected to the first area of the first metal film through a second connection part provided so as to bite into the first metal film.

\* \* \* \* \*